United States Patent
Sadik et al.

(10) Patent No.: US 9,988,263 B2
(45) Date of Patent: Jun. 5, 2018

(54) SUBSTRATE ETCH

(71) Applicant: HEWLETT-PACKARD DEVELOPMENT COMPANY, L.P., Houston, TX (US)

(72) Inventors: Patrick Wayne Sadik, Corvallis, OR (US); Roger A. McKay, Corvallis, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days. days.

(21) Appl. No.: 14/914,215

(22) PCT Filed: Aug. 30, 2013

(86) PCT No.: PCT/US2013/057610
§ 371 (c)(1),
(2) Date: Feb. 24, 2016

(87) PCT Pub. No.: WO2015/030803
PCT Pub. Date: Mar. 5, 2015

(65) Prior Publication Data
US 2016/0200568 A1    Jul. 14, 2016

(51) Int. Cl.
*H01L 21/306* (2006.01)
*B81C 1/00* (2006.01)
*B41J 2/16* (2006.01)

(52) U.S. Cl.
CPC .......... *B81C 1/00063* (2013.01); *B41J 2/162* (2013.01); *B41J 2/1626* (2013.01); *B81B 2201/052* (2013.01); *B81C 2201/0115* (2013.01); *B81C 2201/0133* (2013.01); *B81C 2201/0181* (2013.01)

(58) Field of Classification Search
CPC ................................................ H01L 21/30604
USPC ....................................................... 438/21, 70
See application file for complete search history.

(56) References Cited

U.S. PATENT DOCUMENTS

| 4,894,664 | A | * | 1/1990 | Tsung Pan | ............. B41J 2/1412 205/69 |
| 6,762,134 | B2 | | 7/2004 | Bohn et al. | |
| 8,193,095 | B2 | | 6/2012 | Lin | |
| 8,278,191 | B2 | | 10/2012 | Hildreth | |
| 2009/0142584 | A1 | | 6/2009 | Bedel et al. | |

(Continued)

FOREIGN PATENT DOCUMENTS

WO   WO-2011049804 A2   4/2011
WO   WO-2013093504 A2   6/2013

OTHER PUBLICATIONS

Geyer, N. et al.; "On the Formation Process of Si Nanowires by Metal-assisted Etching"; http://www.mpi-halle.mpg.de/annual_reports/2011.pdf/jb_results_14.pdf.

(Continued)

*Primary Examiner* — Asok K Sarkar
*Assistant Examiner* — Dmitriy Yemelyanov
(74) *Attorney, Agent, or Firm* — HP Inc. Patent Department

(57) ABSTRACT

An example provides a method including sputtering a metal catalyst onto a substrate, exposing the substrate to a solution that reacts with the metal catalyst to form a plurality of pores in the substrate, and etching the substrate to remove the plurality of pores to form a recess in the substrate.

18 Claims, 5 Drawing Sheets

(56) References Cited

U.S. PATENT DOCUMENTS

| | | | |
|---|---|---|---|
| 2010/0072580 A1* | 3/2010 | Shaheen | H01L 21/76251 257/627 |
| 2010/0248449 A1* | 9/2010 | Hildreth | B81C 1/00071 438/460 |
| 2011/0146774 A1 | 6/2011 | Kim et al. | |
| 2011/0263119 A1* | 10/2011 | Li | H01L 21/30604 438/653 |
| 2011/0294255 A1* | 12/2011 | Lin | H01L 31/022425 438/98 |
| 2012/0009501 A1* | 1/2012 | Kang | B82Y 30/00 429/483 |
| 2012/0329271 A1 | 12/2012 | Yang et al. | |
| 2013/0143407 A1* | 6/2013 | Lin | B81C 1/0038 438/694 |

OTHER PUBLICATIONS

Malinsky, P. et al.; "Early Stages of Growth of Gold Layers Sputter Deposited on Glass and Silicon Substrates"; May 6, 2012 http://www.nonoscalereslett.com/content/7/1/241.

Oskam, G. et al.; "Electrochemical Deposition of Metals Onto Silicon"; Nov. 26, 1997; http://citeseerx.ist.psu.edu/viewdoc/download?doi=10.1.1.145.949&rep=rep1&type=pdf.

\* cited by examiner

SUBSTRATE ETCH

BACKGROUND

A number of devices may be implemented with recesses or voids (such as, e.g., a chamber or channel) in a substrate. Micro-electrical-mechanical systems (MEMS) devices, for example, may include air chambers to house components and/or to provide functionality to the devices. Printheads, which sometimes may be MEMS-based, may include firing chambers, ink feed slots, or ink channels.

BRIEF DESCRIPTION OF THE DRAWINGS

The detailed description section references the drawings, wherein.

all in which various examples may be implemented.

Certain examples are shown in the above-identified figures and described in detail below. The figures are not necessarily to scale, and various features and views of the figures may be shown exaggerated in scale or in schematic for clarity and/or conciseness.

DETAILED DESCRIPTION OF EMBODIMENTS

Many devices are fabricated to include recesses or other openings (e.g., chambers, channels, voids, etc.). Micro-electrical-mechanical systems (MEMS) devices, for example, may include chambers to house components and/or to provide functionality to the devices. Printheads may include firing chambers, ink feed slots, or ink channels, and sometimes may be fabricated using MEMS technology. In some cases, recesses or voids may be formed in a layer and the layer may be bonded with at least one other layer to form a device.

Bulk micromachining of substrates may be performed using dry or wet etching processes. Bulk dry etch processes, however, may be lengthy as these processes are commonly performed on a one-wafer-run basis. In some wet etch operations, trenches with sloped, rather than vertical, sidewalls may be formed.

Described herein are implementations of methods for etching a substrate. In some examples, a method for etching a substrate may include providing a substrate including an area having a plurality of pores and etching the area of the substrate to remove the plurality of pores to form a recess in the substrate. In various implementations, etching a substrate including a plurality of pores may facilitate bulk etching of the substrate when fabricating a device, such as, for example, a MEMS device, a printhead, or another device, using the substrate.

Figure 1:
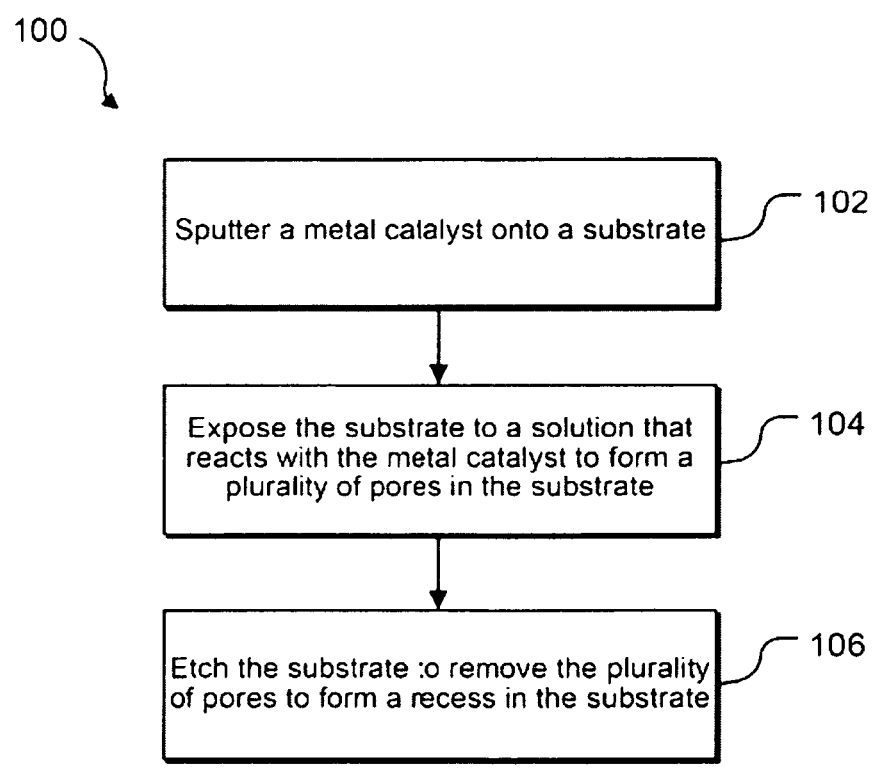
FIG. 1 is a flow diagram of an example method for etching a substrate.

An example method 100 for etching a substrate is illustrated in FIG. 1. Processing for the method 100 may begin or proceed with sputtering a metal catalyst onto a substrate, at block 102. In various implementations, sputtering metal catalyst onto the substrate may provide a discontinuous layer of the metal catalyst having a substantially uniform distribution of a plurality of islands of the metal catalyst across the substrate, with a substantially narrow size distribution as compared to forming particles on a substrate via solution deposition of pre-fabricated nano-spheres on the surface of the substrate. In some implementations, the layer of the metal catalyst may comprise a thin film of the metal catalyst with substantial open areas, such as, for example, a "net" morphology. In some implementations, the layer of the metal catalyst may comprise a continuous layer of the metal catalyst.

In various implementations, a distribution of islands of the metal catalyst may be formed on the substrate by using shortened deposition times at a power dosage such that a discontinuous layer of metal is formed on the substrate rather than a continuous film. For example, islands of the metal catalyst may be sputtered at a power in a range of about 50 W to about 200 W for a time in a range of about 5 seconds to about 60 seconds. The temperature during sputtering may in a range of about 30° C. to about 250° C. The pressure during sputtering may be in a range of about $1^{-2}$ Torr to about $1^{-7}$ Torr.

The substrate may comprise one layer or multiple layers. For example, the substrate may comprise at least one layer of silicon, silicon germanium, a nitride, an oxide, a polymer, a ceramic, a metal, a group III-V material, a combination thereof, etc. In at least some implementations, the substrate may comprise silicon or silicon with at least one other layer thereon. In various implementations, the substrate may comprise any material suitable for forming a device, such as, for example, a MEMS device, a printhead, or another device. Various other substrate materials may be possible within the scope of the present disclosure.

It is noted that although various drawings referenced herein may depict the substrate as a single unitary layer, it should be understood that the substrate may in fact comprise multiple substrate layers and that any reference to a surface of the substrate may mean a surface of a substrate that comprises multiple layers. In some implementations, the substrate may comprise multiple substrates bonded together, and the multiple substrates may comprise the same crystal orientations or different crystal orientations.

The metal may comprise any metal that reacts with the solutions described herein to etch the substrate via metal-assisted chemical etching. For example, in various implementations, the metal may comprise a metal catalyst that reacts with a solution of hydrofluoric acid with hydrogen peroxide or nitric acid, or both, to etch the substrate. Examples of suitable metals may include, but are not limited to, gold, silver, platinum, ruthenium, platinum, palladium, molybdenum, chromium, copper, tantalum, titanium, tungsten, and alloys thereof.

The method 100 may proceed to block 104 by etching the substrate using a solution that reacts with the metal layer to form a plurality of pores in the substrate. In various implementations, the solution may comprise hydrogen peroxide and/or nitric acid with hydrofluoric acid and water, and the etching operation may comprise a metal-assisted chemical etch process in which the metal is a catalyst, and the substrate surface acts as an anode and the metal acts as the cathode. The metal may catalyze the reduction of hydrogen peroxide or nitric acid, which may result in a flow of electrons from the anode to the cathode and the "sinking" of the metal into the substrate to anisotropically etch the substrate. In various implementations, an etch rate using the solution and the metal catalyst may be 5 μm per minute or greater. In various implementations, nitric acid added to a solution of hydrogen peroxide, hydrofluoric acid, and water may add isotrophy to the etch to dissolve the porous substrate as it is created. In some of these implementations, the amount of the nitric acid may control, at least in part, lateral etching of areas near the surface of the substrate while the ratio of the nitric acid to the hydrogen peroxide may control, at least in part, the sidewall profile.

Etching of the substrate by the solution may be performed at ambient temperature or another suitable temperature. Increasing temperature may, in some cases, increase or otherwise impact the etch rate. In some implementations, the etching of the substrate by the solution may be performed under agitation or in a still bath. The solution may be formulated by any concentration to provide a particular etch rate. Likewise, the ratio of hydrogen peroxide to hydrofluoric acid to water or nitric acid to hydrofluoric acid to water may depend on the particular etch rate, and may vary during the etch operation. In various implementations, the etching may be performed under illumination with UV or optical wavelengths, which may increase or other increase efficiency of the etch.

After etching the substrate at block 104, the method 100 may proceed to block 106 by etching the substrate to remove the plurality of pores to form a recess in the substrate. In various implementations, forming the recess in the substrate including the plurality of pores may allow the etch to proceed at a faster rate as compared to etching a substrate without pores. The substrate may be etched to remove the plurality of pores using a wet etch with an etchant such as, but not limited to, tetra-methyl ammonium hydroxide or potassium hydroxide. In other implementations, the substrate may be etched to remove the plurality of pores using a dry etch.

The recess may comprise any opening in the substrate. For example, the recess may comprise a trench, a blind hole, a through-hole, etc. In various implementations, multiple recesses may be formed in the substrate at different locations of the substrate. In various implementations, the recess(es) may form, at least in part, a MEMS device, a printhead device, or another device. In various implementations, a recess may have a width of at least 1 µm. In some of these implementations, the recess may have a width in a range of about 10 µm to about 20 µm.

Understanding of the various methods for etching a substrate as described herein may be facilitated with reference to FIGS. 2-8, which describe various operations for etching a substrate by way of sectional views of the substrate at various stages of the methods. It should be noted that various operations discussed and/or illustrated may be generally referred to as multiple discrete operations in turn to help in understanding various implementations. The order of description should not be construed to imply that these operations are order dependent, unless explicitly stated. Moreover, some implementations may include more or fewer operations than may be described.

Figure 2:
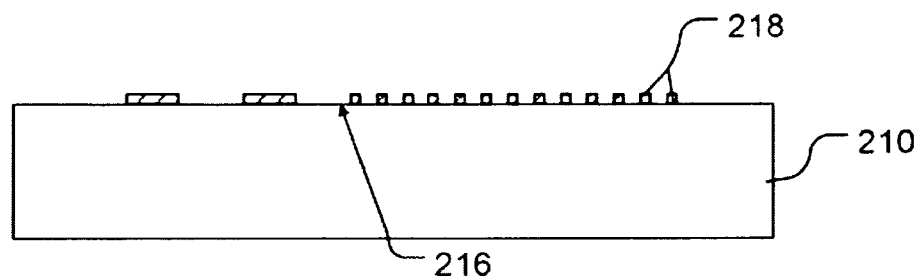
FIGS. 2-5 illustrate sectional views of a substrate at various stages of an example method for etching the substrate.
Figure 3:
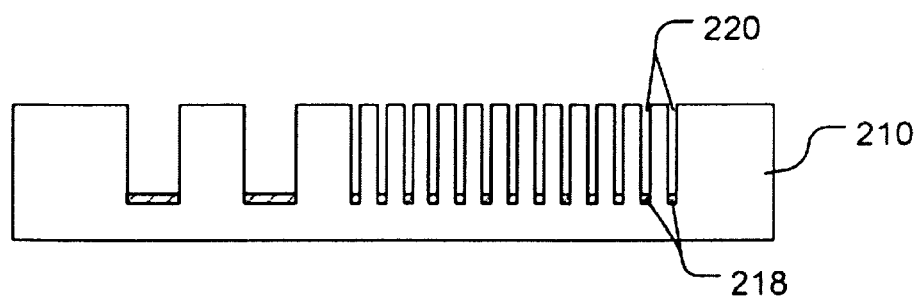

Turning now to FIG. 2, a method for etching a substrate 210, in accordance with various implementations, may begin or proceed with providing a substrate 210 and sputtering a metal catalyst layer 218 onto the surface 216 of the substrate 210, and then etching the substrate 210 using a solution that reacts with the metal catalyst layer 218 to form a plurality of pores 220 in the substrate 210, as shown in FIG. 3.

Figure 4:
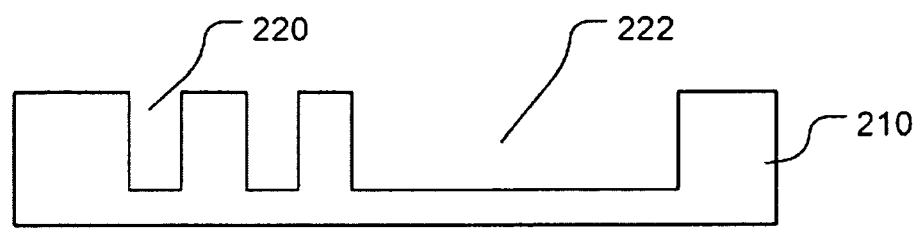

After etching the substrate 210 to form the plurality of pores 220, the substrate 210 may be etched to remove at least some of the plurality of pores 220 to form at least one recess 222 in the substrate 210, as shown in FIG. 4. In various implementations, all or fewer than all of the plurality of pores 220 may be etched. As shown, for example, some of the pores 220 may not be etched while other pores 220 are etched to form the recess 222.

Figure 5:
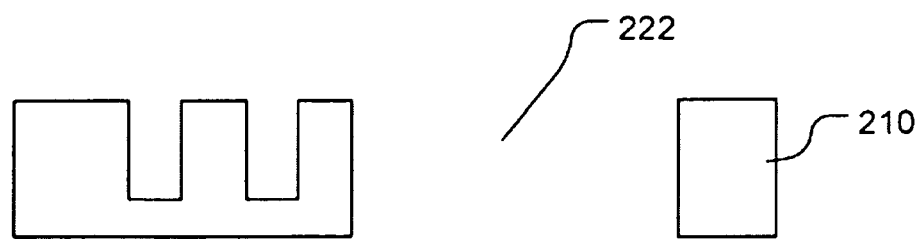

The recess 222 shown in FIG. 4 may be a trench or a blind hole in the substrate 210 or the recess 222 may be formed through an entire thickness of the substrate 210 to form a through-hole, as shown in FIG. 5. The substrate 210 including the recess 222 may form, at least in part, a MEMS device, a printhead, or another device. In various ones of these implementations, a printhead may be formed with the MEMS device.

Figure 6:
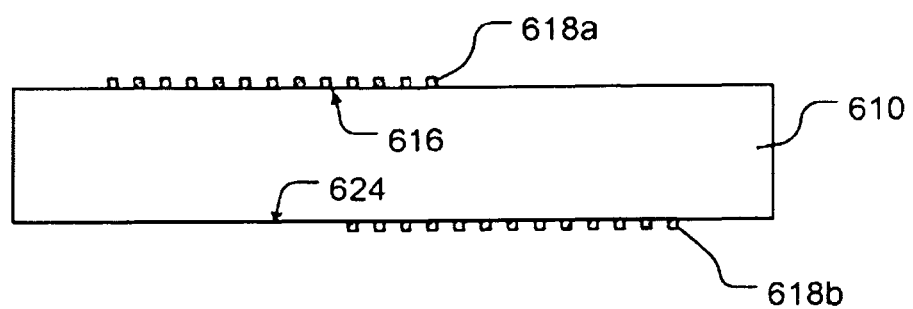
FIGS. 6-8 illustrate sectional views of a substrate at various stages of another example method for etching the substrate.
Figure 7:
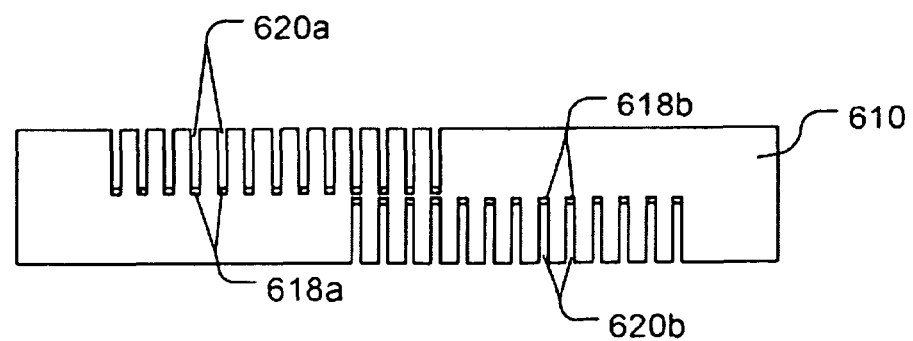

In various implementations, a substrate may be etched on opposite surfaces for forming a device. As shown in FIG. 6, a method for etching a substrate 610 may include sputtering metal catalyst layers 618a, 618b onto the first surface 616 of the substrate 610 and on the second surface 624 of the substrate 610, as shown in FIG. 6. The substrate 610 may be etched using a solution that reacts with the metal catalyst layer 618a, 618b to form a plurality of pores 620a, 620b in each surface of the substrate 610, as shown in FIG. 7.

Figure 8:
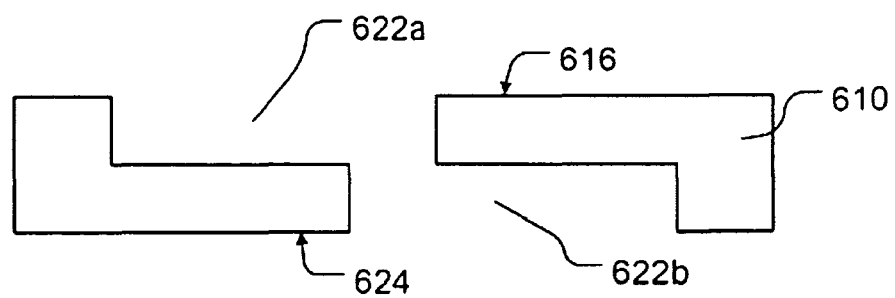

After etching the substrate 610 to form the plurality of pores 620a, 620b, the substrate 610 may be etched to remove at least some of the plurality of pores 620a, 620b to form at least one recess 622a, 622b in each surface of the substrate 610, as shown in FIG. 8. In various implementations, all or fewer than all of the plurality of pores 620a, 620b may be etched. As shown, for example, some of the pores 620a, 620b may not be etched while other pores 620a, 620b are etched to form the recesses 622a, 622b.

As shown, at least one of the recesses 622a in the first surface 616 of the substrate 610 may interconnect with at least one of the recesses 622b in the second surface 624 of the substrate 610, as shown in FIG. 8. Other ones of the recesses 622a, 622b may comprise a trench, a blind hole, another opening, or a combination thereof. The substrate 610 including the recesses 622a, 622b may form, at least in part, a MEMS device, a printhead, or another device. In various ones of these implementations, a printhead may be formed with the MEMS device.

By patterning the substrate 610 on both surfaces 616, 624, more complex devices may be formed or may be formed with fewer separate operations than by patterning the substrate 610 on only one surface. In various implementations, the substrate 610 may comprise multiple substrate layers such as, for example, a silicon substrate bonded to another silicon substrate. The substrate layers may comprise substrates of the same or different crystal orientation. For example, the substrate 610 may comprise two <100>, <110>, or <111> substrates bonded together, and the substrates may be arranged so the crystal orientations align or are offset. In some implementations, the substrate 610 may comprise substrates of different crystal orientations. For example, the substrate 610 may comprise a <100> substrate bonded with є<110> substrate, or some other combination of crystal orientations.

Various aspects of the illustrative embodiments are described herein using terms commonly employed by those skilled in the art to convey the substance of their work to others skilled in the art. It will be apparent to those skilled in the art that alternate embodiments may be practiced with only some of the described aspects. For purposes of explanation, specific numbers, materials, and configurations are set forth in order to provide a thorough understanding of the illustrative embodiments. It will be apparent to one skilled in the art that alternate embodiments may be practiced without the specific details. In other instances, well-known features are omitted or simplified in order not to obscure the illustrative embodiments.

Flow diagrams are provided to describe various methods for etching a substrate, in accordance with various implementations. While the flow diagrams illustrate various operations in a particular order, the drawings are not intended to limit the present disclosure to any particular order. Additionally, the drawings are not intended to imply that all operations are required for all implementations.

The phrases "in an example," "in various examples," "in some examples," "in various embodiments," and "in some embodiments" are used repeatedly. The phrases generally do not refer to the same embodiments: however, they may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B". The phrase "at least one of A, B, and C" means (A), (B), (C), (A and B), (A and C), (B and C), or (A, B and C). The phrase "(A) B" means (B) or (A and B), that is, A is optional. Usage of terms like "top", "bottom", and "side" are to assist in understanding, and they are not to be construed to be limiting on the disclosure.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope of this disclosure. Those with skill in the art will readily appreciate that embodiments may be implemented in a wide variety of ways. This application is intended to cover any adaptations or variations of the embodiments discussed herein. It is manifestly intended, therefore, that embodiments be limited only by the claims and the equivalents thereof.

What is claimed is:

1. A method comprising:
sputtering first islands of a metal catalyst onto an unpatterned, unmasked flat face of a substrate;
sputtering second islands of the metal catalyst onto the unpatterned, flat face of the substrate, the second islands being different than the first islands in at least one of inter-island spacing and individual island size;
forming a first plurality of pores in the substrate corresponding to the first islands and a second plurality of pores in the substrate corresponding to the second islands by exposing the substrate to a solution that reacts with the first islands and the second islands of the metal catalyst; and
forming a recess in the substrate by etching the substrate to remove the first plurality of pores.

2. The method of claim 1, wherein the metal catalyst comprises a metal selected from a group consisting of gold, silver, platinum, ruthenium, platinum, palladium, molybdenum, chromium, copper, tantalum, titanium, tungsten, and alloys thereof.

3. The method of claim 1, wherein said sputtering of the first islands and said sputtering of the second islands is performed at a power in a range of about 50 W to about 200 W for a time in a range of about 5 seconds to about 60 seconds.

4. The method of claim 1, wherein the solution comprises hydrogen peroxide, hydrofluoric acid, and water.

5. The method of claim 1, wherein said etching, by which the recess in the substrate is formed from the removal of the first plurality of pores, comprises performing an isotropic etch of the substrate.

6. The method of claim 1, wherein said etching, by which the recess in the substrate is formed from the removal of the plurality of pores, comprises performing an anisotropic etch of the substrate to remove the first plurality of pores to form the recess in the substrate.

7. The method of claim 1, wherein said etching comprises bulk etching the substrate using tetra-methyl ammonium hydroxide, potassium hydroxide, hydrofluoric acid, or nitric acid.

8. The method of claim 1, wherein the recess comprises a through-hole.

9. The method of claim 1, wherein the recess has a width of at least 1 um.

10. The method of claim 1, wherein the recess has a width in a range of about 10 um to about 20 um.

11. The method of claim 1, wherein the substrate comprises silicon.

12. The method of claim 1, wherein said etching of the substrate is carried out to maintain the second plurality of pores.

13. The method of claim 1, wherein the first face is an unpatterned flat face continuously extending in a single plane from a first edge to a second opposite edge of the substrate.

14. The method of claim 1, wherein each of the first islands and the each of second islands have unopposed sides immediately following the sputtering.

15. A method comprising:
sputtering a first layout of first islands of a metal catalyst onto a first face of a substrate;
sputtering a second layout of second islands of the metal catalyst onto a second face of the substrate, the second face extending opposite the first face, wherein the first layout partially overlaps the second layout;
forming a first plurality of pores in the substrate corresponding to the first islands and a second plurality of pores in the substrate corresponding to the second islands by exposing the substrate to a solution that reacts with the first islands of the metal catalyst and the second islands of the metal catalyst;
forming a first recess in the first face of the substrate by removing the first plurality of pores by etching the substrate; and
forming a second recess in the second face of the substrate by removing the second plurality of pores by etching the substrate, wherein the first recess and the second recess partially overlap one another.

16. The method of claim 15, wherein the substrate comprises at least a portion of a printhead.

17. The method of claim 15, wherein the first face is an unpatterned flat face continuously extending in a single plane from a first edge to a second opposite edge of the substrate.

18. The method of claim 15, wherein each of the first islands and the each of second islands have unopposed sides immediately following the sputtering of the first layout of first islands and the second layout of second islands.

* * * * *

UNITED STATES PATENT AND TRADEMARK OFFICE
CERTIFICATE OF CORRECTION

| | |
|---|---|
| PATENT NO. | : 9,988,263 B2 |
| APPLICATION NO. | : 14/914215 |
| DATED | : June 5, 2018 |
| INVENTOR(S) | : Patrick Wayne Sadik et al. |

Page 1 of 1

It is certified that error appears in the above-identified patent and that said Letters Patent is hereby corrected as shown below:

On the Title Page

Item (72), Inventors, Line 2, delete "Roger A. McKay," and insert -- Roger A. McKay, Jr. --, therefor.

In the Drawings

In Figure 1, sheet 1 of 5, reference numeral 106, Line 1, after "substrate" delete ":o".

Signed and Sealed this
Fifth Day of February, 2019

Andrei Iancu
*Director of the United States Patent and Trademark Office*